(12) United States Patent
Asagiri et al.

(10) Patent No.: US 9,597,824 B2
(45) Date of Patent: Mar. 21, 2017

(54) CONTROL MODULE MANUFACTURING METHOD

(75) Inventors: Satoru Asagiri, Yokohama (JP); Kyoko Kato, Yokohama (JP); Yasuyuki Ito, Saku (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 857 days.

(21) Appl. No.: 13/240,090

(22) Filed: Sep. 22, 2011

(65) Prior Publication Data

US 2012/0074608 A1 Mar. 29, 2012

(30) Foreign Application Priority Data

Sep. 24, 2010 (JP) ................................. 2010-214355

(51) Int. Cl.
| | |
|---|---|
| *B29C 43/18* | (2006.01) |
| *B29C 70/70* | (2006.01) |
| *B29C 39/10* | (2006.01) |
| *H01L 23/28* | (2006.01) |
| *H01L 23/29* | (2006.01) |

(52) U.S. Cl.
CPC .............. *B29C 43/18* (2013.01); *B29C 39/10* (2013.01); *B29C 70/70* (2013.01); *B29C 2043/181* (2013.01); *H01L 23/295* (2013.01); *H01L 2924/0002* (2013.01)

(58) Field of Classification Search
CPC ...... H05K 5/0056; H05K 5/064–5/065; B29C 33/0016
USPC ............ 174/521; 264/267, 268, 269, 272.11, 264/272.13, 272.14, 273, 279, 279.1
See application file for complete search history.

(56) References Cited

U.S. PATENT DOCUMENTS

| | | | | |
|---|---|---|---|---|
| 3,650,648 A | * | 3/1972 | Lambrecht | ................. 425/129.1 |
| 4,293,519 A | * | 10/1981 | Knappenberger et al. | ........................ 264/272.13 |
| 4,618,467 A | * | 10/1986 | Burger et al. | ................. 264/46.6 |
| 5,874,324 A | * | 2/1999 | Osada | ............................ 438/124 |
| 6,946,048 B2 | * | 9/2005 | Koch | ............................ 156/245 |
| 7,510,618 B2 | * | 3/2009 | Koch | .................. B29C 33/0016 152/152.1 |

(Continued)

FOREIGN PATENT DOCUMENTS

| | | |
|---|---|---|
| DE | 197 55 408 A1 | 12/1998 |
| JP | 2-28993 | 1/1990 |

(Continued)

OTHER PUBLICATIONS

JPH08118859 (A) (Yanagihara Junichi) May 14, 1996 (abstract). [online] [retrieved on May 23, 2014]. Retrieved from European Patent Office using Internet <URL: http://ep.espacenet.com>.*

(Continued)

*Primary Examiner* — Atul P. Khare
(74) *Attorney, Agent, or Firm* — Oblon, McClelland, Maier & Neustadt, L.L.P.

(57) ABSTRACT

In one embodiment, a control module manufacturing method includes disposing a board, on which electronic components are mounted, in a case includes a top opening, injecting a filler into the case, pressing the filler from the surface side thereof by means of a jig, which comprises an upwardly convex hollow portion corresponding to taller ones of the electronic components with respect to the board and covers the opening and curing the filler.

5 Claims, 4 Drawing Sheets

(56) References Cited

U.S. PATENT DOCUMENTS

| | | | |
|---|---|---|---|
| 9,005,504 B2* | 4/2015 | Kurita | B29C 39/006 264/272.13 |
| 2006/0272150 A1* | 12/2006 | Eguchi et al. | 29/841 |
| 2011/0127694 A1* | 6/2011 | Kurita | B29C 39/006 264/272.13 |

FOREIGN PATENT DOCUMENTS

| | | | |
|---|---|---|---|
| JP | 2-244792 | | 9/1990 |
| JP | 05326597 A | * | 12/1993 |
| JP | 6-21280 U | | 3/1994 |
| JP | 8-118859 | | 5/1996 |
| JP | 08222011 A | * | 8/1996 |
| JP | 2000-85026 | | 3/2000 |
| JP | 2000-165021 | | 6/2000 |
| JP | 2000165021 A | * | 6/2000 |
| JP | 2001-7127 | | 1/2001 |
| JP | 2003-86925 | | 3/2003 |
| JP | 2005-340698 | | 12/2005 |
| JP | 2007-243210 | | 9/2007 |
| JP | 2009-289494 | | 12/2009 |
| WO | WO 2010146860 A1 * | 12/2010 | B29C 39/006 |

OTHER PUBLICATIONS

Chinese Office Action issued Aug. 23, 2013, in China Patent Application No. 201110278618.0 (with English translation).
Notification for Filing Opinion issued Feb. 25, 2013 in Korean Patent Application No. 10-2011-0093566 (with English absteract).
Office Action issued Sep. 11, 2012 in Japanese Application No. 2010-214355 (With English Translation).

* cited by examiner

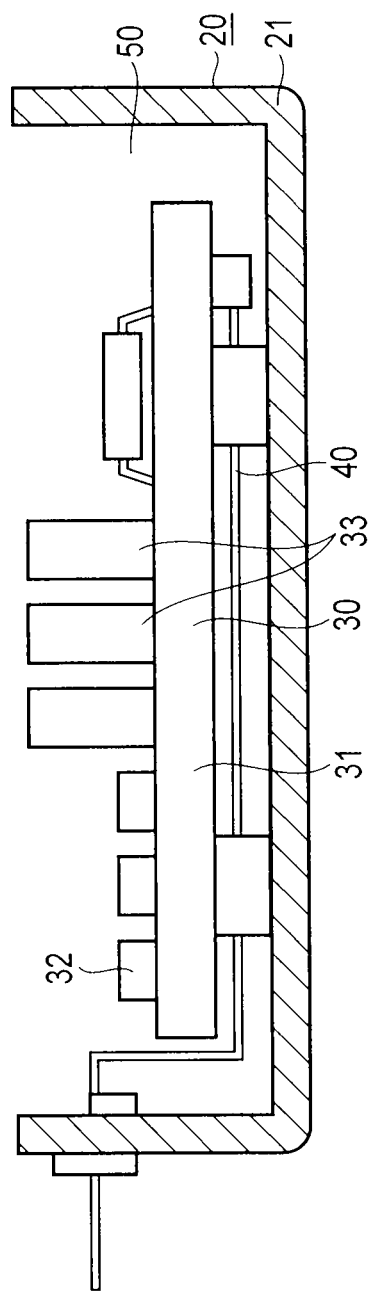
F I G. 2

CONTROL MODULE MANUFACTURING METHOD

CROSS-REFERENCE TO RELATED APPLICATIONS

This application is based upon and claims the benefit of priority from prior Japanese Patent Application No. 2010-214355, filed Sep. 24, 2010, the entire contents of which are incorporated herein by reference.

FIELD

The present embodiment relates to a manufacturing method of control module mounted on a motorcycle, bicycle, washing machine, or the like.

BACKGROUND

An electric motorcycle or electric bicycle mounted with a large battery uses a control module for monitoring the voltage and temperature of the battery. A washing machine or the like also uses a current control module. These control modules are required to be water-resistant because of the supposition of water splashing on them. To this end, a printed circuit board of control module in a known structure is sealed with a resin (filler).

In these control modules, a control board mounted with conducting members and electronic components is disposed in an electrically insulating case, which is injected and hardened with a liquid filler. The filler is water-resistant and electrically insulating. To prevent voids, the injection and hardening of the filler is performed under reduced pressure in a decompression chamber. A failure occurs if aluminum electric field capacitors for use as the electronic components are kept under reduced pressure, because of their nature. Thus, the filler must be injected and hardened under normal pressure.

In the control module manufacturing method, the amount of filler used for sealing is determined in accordance with the size of large-sized electronic components so as to cover all electronic components with resin, and the filler for sealing must be fully injected to reach the edge of the case. Possibly, therefore, the filler may overflow the case during delivery to a subsequent process or the like. Since the filler must be injected into regions where sealing is not required, i.e., into regions located above small-sized components, weight reduction is inhibited and the high material cost becomes a problem.

An object of the present embodiment is to provide a control module manufacturing method in which the amount of resin used can be reduced and delivery to a subsequent process can be facilitated.

BRIEF DESCRIPTION OF THE DRAWINGS

FIG. 2 is a longitudinal sectional view schematically showing the control module;

DETAILED DESCRIPTION

In a control module manufacturing method according to one aspect, a board on which electronic components are mounted is disposed in a case comprising a top opening, a filler is injected into the case, the filler is pressed from the surface side thereof by means of a jig, which comprises an upwardly convex hollow portion corresponding to taller ones of the electronic components with respect to the board and covers the opening, and the filler is cured.

In a control module manufacturing method according to another aspect, a board on which electronic components are mounted is disposed in a case comprising a top opening, a jig which comprises an upwardly convex hollow portion corresponding to taller ones of the electronic components with respect to the board and covers the opening is disposed, a filler is injected between the case and the jig, and the filler is cured.

Figure 1:
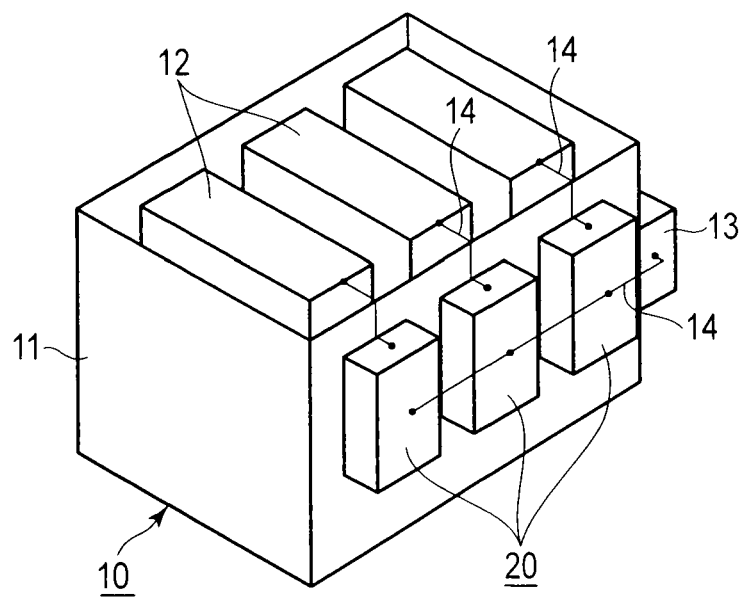
FIG. 1 is a perspective view schematically showing a battery pack that uses control modules manufactured by a control module manufacturing method according to one embodiment.

FIG. 1 is a perspective view schematically showing a battery pack 10 that uses control modules 20 manufactured by a control module manufacturing method according to one embodiment, and FIG. 2, 3, 4 are longitudinal sectional view schematically showing one of the control modules 20.

In FIG. 1, number 10 denotes a battery pack mounted on an electric motorcycle or the like. The battery pack 10 comprises a housing 11, batteries 12 accommodated in the housing 11, control modules 20, and interface portion 13. The control modules 20 control the voltage and temperature of the batteries 12. The interface portion 13 transmits data from the control modules 20 to the outside. In FIG. 1, number 14 denotes lead wires.

Figure 4:
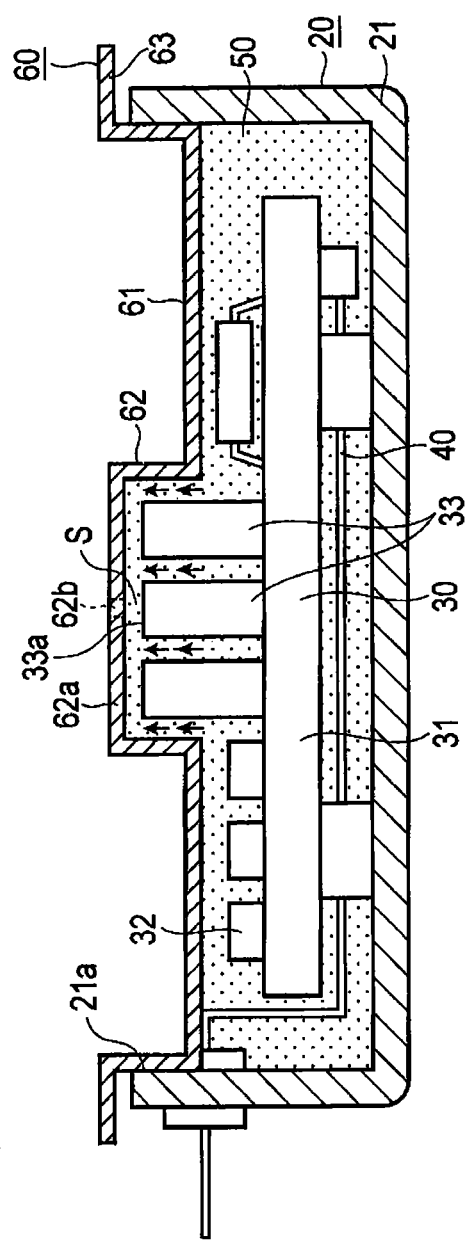
FIG. 4 is a longitudinal sectional view schematically showing the control module.

As shown in FIG. 4, the control module 20 consists mainly of an electrically insulating material and comprises a case 21 with a top opening 21a. The case 21 accommodates a control board 30 and cable 40 through which currents and signals are input and output between the control board 30 and the outside. The control board 30 and cable 40 are sealed with a filler 50. For example, urethane is used for the filler 50. Alternatively, a water-resistant thermosetting or thermoplastic resin may be used for the filler 50.

The control board 30 comprises a board main body 31, such as a printed circuit board, electronic components 32 mounted on the upper surface of the board main body 31, and aluminum electric field capacitors 33. The capacitors 33 are formed taller than the electronic components 32 with respect to the board main body 31.

The following is a description of the manufacturing method for the control modules 20. First, as shown in FIG. 2, the control board 30 and cable 40 are mounted in the case 21.

Figure 3:
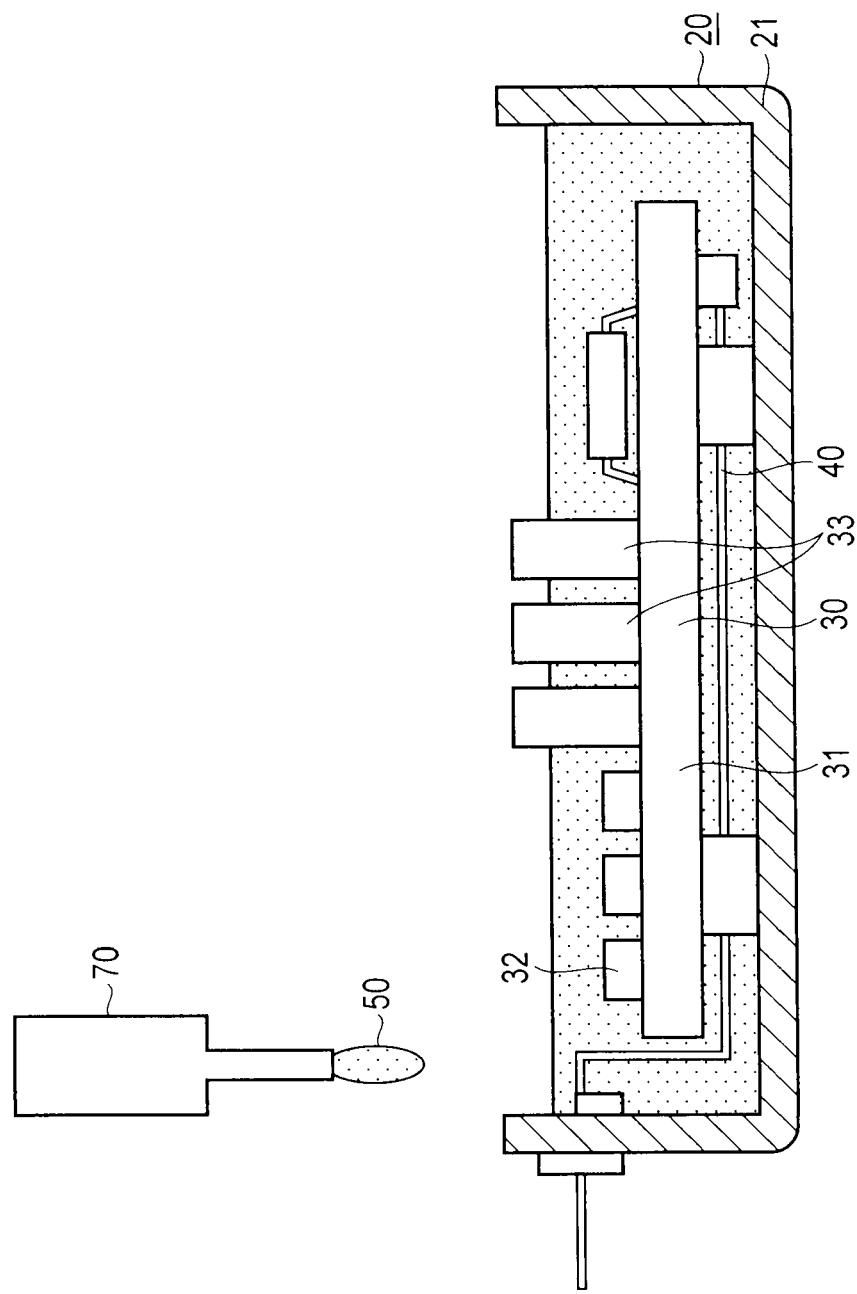
FIG. 3 is a longitudinal sectional view schematically showing the control module.

Then, as shown in FIG. 3, the liquid filler 50 is injected through a filler nozzle 70 into the case 21. The filler 50 is injected in an amount such that it fully covers the electronic components 32 but does not reach the height level of the aluminum electric field capacitors 33.

Subsequently, as shown in FIG. 4, a jig 60 is set so that it closes the opening 21a of the case 21. The jig 60 comprises a jig body 61, upwardly convex hollow portion 62 formed in jig body 61, and flange portion 63 formed along the outer periphery of the jig body 61. The hollow portion 62 corresponds in position to the aluminum electric field capacitors 33 and is formed with a gap S that can fully accommodate the filler 50 between top portions 33a of the capacitors 33 and a bottom part 62a of the hollow portion 62 when the hollow portion 62 is sealed with the filler 50.

Preferably, moreover, polypropylene that is good in mold releasability from urethane should be used as the material for the jig 60.

If the jig 60 is put on the case 21 that is injected with the filler 50, the lower surface of the jig body 61 contacts the surface of the filler 50, whereupon some of the filler 50 gets into the hollow portion 62 under the resulting pressure. If the jig 60 is caused to vibrate by being slapped, for example, the filler 50 smoothly flows in toward the bottom part 62a of the hollow portion 62. Finally, the interior of the hollow portion 62 is filled up with the filler 50. The filler 50 can also be introduced by a capillary phenomenon if the gap between the aluminum electric field capacitors 33 and hollow portion 62 is set properly.

Then, the case 21 with the jig 60 thereon is delivered to a subsequent process, e.g., curing in a curing oven. Since the opening 21a of the case 21 is covered by the jig 60, even the uncured filler 50 can be easily delivered without overflowing.

Finally, the filler 50 is heated to be thermally cured in the curing oven. The method of curing the filler 50 is not limited to thermal curing and may alternatively be based on ultraviolet irradiation. Thus, only the taller aluminum electric field capacitors 33 are thickly sealed, and the other shorter electronic components 32 thinly sealed.

Preferably, mutually releasable materials should be suitably selected for the filler 50 and jig 60. Further, an aperture 62b may be formed in the bottom part 62a of the hollow portion 62 of the jig 60 such that air confined during filling operation can be released.

According to the control module manufacturing method of the present embodiment described above, only the taller electronic components can be thickly sealed, and the shorter ones thinly sealed, so that the amount of resin used can be reduced to achieve weight reduction. Since the filler can be prevented from overflowing the case, moreover, the delivery to a subsequent process can be facilitated.

In the embodiment described above, the jig 60 is located after the filler 50 is injected. Alternatively, however, a thermoplastic resin may be injected after the jig 60 is set in place and be cured for sealing without using a curing oven.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control module manufacturing method comprising:
   disposing a board, on which taller electronic components and shorter electronic components are mounted, between side surfaces of a case comprising a bottom surface and a top opening;
   injecting a filler into the case to a position lower than an uppermost portion of the side surfaces so as to incompletely fill the case to a level incompletely covering the taller electronic components;
   pressing a jig into the incompletely filled case and against the incompletely filled filler from a surface side thereof, the jig comprising a jig body having an upwardly disposed convex portion forming a cavity accommodating the taller electronic components, the jig thereby covering the top opening and pressing the filler so that the filler flows upward from the incomplete fill level and into the cavity so as to completely cover the taller electronic components including uppermost sides thereof; and
   curing the pressed filler so as to integrate the pressed filler with the case.

2. The control module manufacturing method according to claim 1, further comprising vibrating the jig during said injecting.

3. The control module manufacturing method according to claim 1, wherein the jig is formed with an aperture in a bottom part of the upwardly convex portion.

4. The control module manufacturing method according to claim 1, wherein the jig and the filler consist mainly of mutually releasable materials.

5. The control module manufacturing method according to claim 1, wherein the bottom surface is formed between the side surfaces as a one piece construction therewith.

* * * * *